US009535834B2

(12) United States Patent
Kim et al.

(10) Patent No.: US 9,535,834 B2
(45) Date of Patent: Jan. 3, 2017

(54) ELECTRONIC DEVICE INCLUDING MEMORY ARRAYS WITH VARIABLE RESISTANCE STORAGE ELEMENTS ARRANGED ON DIFFERENT SIDES OF A WORD LINE DRIVING UNIT

(71) Applicants: Dong-Keun Kim, Gyeonggi-do (KR); Masahiro Takahashi, Tokyo (JP); Tsuneo Inaba, Tokyo (JP)

(72) Inventors: Dong-Keun Kim, Gyeonggi-do (KR); Masahiro Takahashi, Tokyo (JP); Tsuneo Inaba, Tokyo (JP)

(73) Assignees: SK Hynix Inc., Gyeonggi-do (KR); Kabushiki Kaisha Toshiba, Tokyo (JP)

( * ) Notice: Subject to any disclaimer, the term of this patent is extended or adjusted under 35 U.S.C. 154(b) by 58 days.

(21) Appl. No.: 14/563,645

(22) Filed: Dec. 8, 2014

(65) Prior Publication Data

US 2015/0332760 A1    Nov. 19, 2015

(30) Foreign Application Priority Data

May 19, 2014 (KR) ........................ 10-2014-0059574

(51) Int. Cl.
*G06F 12/08* (2016.01)
*G11C 13/00* (2006.01)
(Continued)

(52) U.S. Cl.
CPC ........... *G06F 12/08* (2013.01); *G06F 12/0875* (2013.01); *G11C 11/1655* (2013.01); *G11C 11/1673* (2013.01); *G11C 13/004* (2013.01); *G11C 13/0026* (2013.01); *G06F 2212/452* (2013.01); *G11C 11/4099* (2013.01); *G11C 13/0002* (2013.01); *G11C 13/0004* (2013.01); *G11C 13/0007* (2013.01); *G11C 2013/0054* (2013.01);
(Continued)

(58) Field of Classification Search
CPC ........... G06F 12/0875; G06F 2212/452; G11C 13/004; G11C 2013/0054
See application file for complete search history.

(56) References Cited

U.S. PATENT DOCUMENTS

| 6,621,756 | B2 * | 9/2003 | Lin ........................... G11C 8/14 |
| | | | 365/230.03 |
| 7,233,519 | B2 * | 6/2007 | Hidaka ................... G11O 5/063 |
| | | | 365/158 |

(Continued)

FOREIGN PATENT DOCUMENTS

| KR | 1020050068806 | 7/2005 |
| KR | 1020120063736 | 6/2012 |

*Primary Examiner* — Sanjiv Shah
*Assistant Examiner* — Glenn Gossage
(74) *Attorney, Agent, or Firm* — IP & T Group LLP

(57) ABSTRACT

An electronic device includes a semiconductor device, wherein the semiconductor device includes: a word line driving unit for driving a plurality of word lines; a first cell array arranged at one side of the word line driving unit; a second cell array arranged at the other side of the word line driving unit; a bias voltage generation unit, arranged between the first cell array and the second cell array, for generating a bias voltage based on currents flowing through the first reference resistance element included in the first cell array and the second reference resistance element included in the second cell array; a first read control unit; and a second read control unit.

16 Claims, 9 Drawing Sheets

(51) Int. Cl.
  *G11C 11/4099* (2006.01)
  *G11C 11/16* (2006.01)
(52) U.S. Cl.
  CPC ....... *G11C 2213/79* (2013.01); *G11C 2213/82* (2013.01)

(56) References Cited

U.S. PATENT DOCUMENTS

| | | | | |
|---|---|---|---|---|
| 7,952,916 | B2* | 5/2011 | Maeda | G11C 11/16 365/158 |
| 2002/0003720 | A1* | 1/2002 | Bohm | G11C 11/16 365/158 |
| 2005/0180205 | A1* | 8/2005 | Park | G11C 7/062 365/171 |
| 2009/0027953 | A1 | 1/2009 | Kang et al. | |
| 2009/0027956 | A1* | 1/2009 | Choi | G11C 8/10 365/163 |
| 2009/0122598 | A1* | 5/2009 | Toda | G11C 5/063 365/158 |
| 2009/0135642 | A1* | 5/2009 | Kim | G11C 7/062 365/148 |
| 2009/0201710 | A1* | 8/2009 | Ueda | G11C 7/062 365/51 |
| 2010/0091550 | A1 | 4/2010 | Chen et al. | |
| 2010/0118593 | A1* | 5/2010 | Cho | H01L 45/148 365/148 |
| 2012/0147664 | A1* | 6/2012 | Rho | G11C 11/15 365/158 |
| 2013/0094277 | A1* | 4/2013 | Rho | G11C 13/0026 365/148 |
| 2013/0343116 | A1* | 12/2013 | Lua | G11C 11/1675 365/158 |

\* cited by examiner

ELECTRONIC DEVICE INCLUDING MEMORY ARRAYS WITH VARIABLE RESISTANCE STORAGE ELEMENTS ARRANGED ON DIFFERENT SIDES OF A WORD LINE DRIVING UNIT

CROSS-REFERENCE TO RELATED APPLICATIONS

This patent document claims priority of Korean Patent Application No. 10-2014-0059574, entitled "ELECTRONIC DEVICE" and filed on May 19, 2014, which is incorporated herein by reference in its entirety.

BACKGROUND

1. Field

Exemplary embodiments of the present invention relate to a memory circuit or device, and an application thereof in an electronic device.

2. Description of the Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse (electrical fuse), etc.

SUMMARY

Various embodiments are directed to an electronic device in which two cell arrays share a reference cell to reduce an area.

Also, various embodiments are directed to an electronic device in which a reference voltage generation unit for generating a reference voltage is arranged in an area, in which a word line driving unit is arranged, between two cell arrays to reduce an area.

In an implementation, there is provided an electronic device including a semiconductor memory unit. The semiconductor memory unit may include: a word line driving unit suitable for driving a plurality of word lines; a first cell array arranged at one side of the word line driving unit, wherein the first cell array includes a plurality of first storage cells each having a variable resistance element and being selected when a corresponding word line is activated among the plurality of word lines, and a first reference resistance element having a first resistance value and being arranged adjacent to the word line driving unit; a second cell array arranged at the other side of the word line driving unit, wherein the second cell array includes a plurality of second storage cells, each having a variable resistance element and being selected when a corresponding word line is activated among the plurality of word lines, and a second reference resistance element having a second resistance value and being arranged adjacent to the word line driving unit; a bias voltage generation unit arranged between the first cell array and the second cell array and suitable for generating a bias voltage based on currents flowing through the first reference resistance element and the second reference resistance element; and a read control unit suitable for reading data of storage cells selected among the plurality of first and second storage cells based on the bias voltage.

The bias voltage generation unit may be arranged adjacent to the word line driving unit.

The read control unit may generate a reference current based on the bias voltage, and compare the currents flowing through the selected storage cells with the reference current to read the data of the selected storage cells.

The variable resistance element may have a first resistance value when first data is stored in the storage cell, and have a second resistance value different from the first resistance value when second data different from the first data is stored in the storage cell.

The reference current may have a current amount between a current amount of a first read current flowing when the first data is stored in the storage cell and a current amount of a second read current flowing when the second data is stored in the storage cell.

The bias voltage generation unit may transfer an external voltage as the bias voltage when a test signal is activated.

The variable resistance element may include one or more of metal oxide, a phase change material, and a structure in which a tunnel barrier layer is interposed between two ferromagnetic layers.

The first cell array and the second cell array may be adjacent to each other.

In an implementation, there is provided an electronic device including a semiconductor memory unit. The semiconductor memory unit may include: a word line driving unit suitable for driving a plurality of word lines; a first cell array arranged at one side of the word line driving unit, wherein the first cell array includes one or more first columns, each of which includes a plurality of first storage cells each having a variable resistance element and being selected when a corresponding word line is activated, and a first reference column arranged adjacent to the word line driving unit, which includes a plurality of first reference cells each having a first resistance value and being selected when a corresponding word line is activated; a second cell array arranged at the other side of the word line driving unit, wherein the second cell array includes one or more second columns, each of which includes a plurality of second storage cells each having a variable resistance element and being selected when a corresponding word line is activated, and a second reference column arranged adjacent to the word line driving unit, which includes a plurality of second reference cells having a second resistance value and being selected when a corresponding word line is activated; a bias voltage generation unit arranged between the first cell array and the second cell array and suitable for generating a bias voltage based on currents flowing through a selected first reference cell and a selected second reference cell; and a read control unit suitable for reading data of storage cells selected among the plurality of first and second columns based on the bias voltage.

The bias voltage generation unit may be arranged adjacent to the word line driving unit.

The read control unit may generate a reference current based on the bias voltage, compare the currents flowing through the selected storage cells with the reference current to read the data of the selected storage cells.

Each of the one or more first columns may include: a bit line coupled to the read control unit and coupled to one end of the plurality of first storage cells; and a source line coupled to the other end of the plurality of first storage cells.

Each of the one or more second columns may include: a bit line coupled to the read control unit and coupled to one end of the plurality of second storage cells; and a source line coupled to the other end of the plurality of second storage cells.

The bias voltage generation unit may transfer an external voltage as the bias voltage when a test signal is activated.

The first reference column may include: a bit line coupled to one end of the plurality of first reference cells; and a source line coupled to the other end of the plurality of first reference cells.

The second reference column may include: a bit line coupled to one end of the plurality of second reference cells; and a source line coupled to the other end of the plurality of second reference cells.

The variable resistance element may include one or more of metal oxide, a phase change material, and a structure in which a tunnel barrier layer is interposed between two ferromagnetic layers.

The first cell array and the second cell array may be adjacent to each other.

The electronic device further comprising a microprocessor which may include: a control unit that is configured to receive a signal including a command from outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

The electronic device further comprising a processor which may include: a core unit configured to perform, based on a command inputted from outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

The electronic device further comprising a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

The electronic device further comprising a data storage system which may include: a storage device configured to store data and conserve stored data regardless of power supply; a controller configured to control input and output of data to and from the storage device according to a command inputted from outside of the data storage system; a temporary storage device configured to temporarily store data exchanged between the storage device and the outside; and an interface configured to perform communication between at least one of the storage device, the controller and the temporary storage device and the outside, wherein the semiconductor memory unit is part of the cache memory unit in the processor.

The electronic device further comprising a memory system which may include: a memory configured to store data and conserve stored data regardless of power supply; a memory controller configured to control input and output of data to and from the memory according to a command inputted from outside; a buffer memory configured to buffer data exchanged between the memory and the outside of the memory system; and an interface configured to perform communication between at least one of the memory, the memory controller and the buffer memory and the outside, wherein the semiconductor memory unit is part of the cache memory unit in the processor.

In an implementation, there is provided an electronic device including a semiconductor memory unit. The semiconductor memory unit may include: a first circuit area including a plurality of first storage cells, each having a variable resistance element and being selected when a corresponding word line is activated, a first reference resistance element having a first resistance value, and a first read control unit for reading data of a storage cell selected among the plurality of first storage cells based on a bias voltage; a second circuit area including a plurality of second storage cells, each having a variable resistance element and being selected when a corresponding word line is activated, a second reference resistance element having a second resistance value, and a second read control unit for reading data of a storage cell selected among the plurality of second storage cells based on the bias voltage, and for being arranged spaced apart from the first circuit area; and a third circuit area arranged between the first circuit area and the second circuit area, wherein the third circuit area includes a word line driving unit for driving a plurality of word lines, and a bias voltage generation unit for generating the bias voltage based on currents flowing through the first reference resistance element and the second reference resistance element, wherein the first reference resistance element and the second reference resistance element are arranged adjacent to the third circuit area.

The first read control unit and the second read control unit may generate a reference current based on the bias voltage, compare the currents flowing through the selected storage cells with the reference current to read the data of the selected storage cells.

The bias voltage generation unit may transfer an external voltage as the bias voltage when a test signal is activated.

The variable resistance element may include one or more of metal oxide, a phase change material, and a structure in which a tunnel barrier layer is interposed between two ferromagnetic layers.

The first circuit area may include a first cell array including the plurality of first storage cells, the second circuit area may include a second cell array including the plurality of second storage cells, and the first cell array and the second cell array may be adjacent to each other.

The first cell array may be arranged adjacent to the bias voltage generation unit on one side of the bias voltage generation unit, and the second cell array is arranged adjacent to the bias voltage generation unit on the other side of the bias voltage generation unit.

In accordance with the electronic device according to the aforementioned embodiments, two cell arrays share a reference cell for storing different types of data, so that an area can be reduced.

Furthermore, since a reference voltage generation unit for generating a reference voltage is arranged in an area in which a word line driving unit is arranged, an additional area for arranging the reference voltage generation unit is not required, so that an area can be reduced.

DETAILED DESCRIPTION

Figure 1:
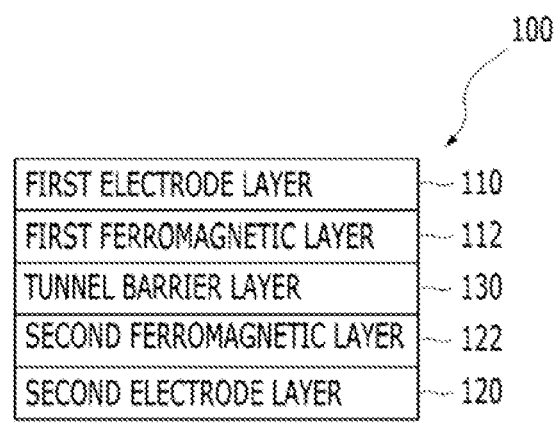
FIG. 1 is an embodiment of a magnetic tunnel junction (MTJ) structure in which a tunnel barrier layer is interposed between two ferromagnetic layers.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

A semiconductor device according to embodiments of the present invention may include a variable resistance element. Hereinafter, the variable resistance element has a variable resistance characteristic, and may include a single layer or a multilayer. For example, the variable resistance element may include a material used in a RRAM, a PRAM, a MRAM, a FRAM and so on, for example, chalcogenide-based compound, transition metal compound, a ferroelectric, a ferromagnetic body, and so on. However, the present invention is not limited thereto, and it is sufficient if the variable resistance element has a variable resistance characteristic in which it is switched between different resistant states according to a voltage or a current applied to both ends thereof.

In more detail, the variable resistance element may include metal oxide. The metal oxide, for example, may include transition metal oxide such as nickel oxide, a titanium oxide, a hafnium oxide, a zirconium oxide, a tungsten oxide, or a cobalt oxide, a perovskite-based material such as STO (SrTiO) or PCMO (PrCaMnO), and so on. Such a variable resistance element may have a characteristic that it is switched between different resistant states by the generation/destruction of a current filament due to the movement of vacancy.

Furthermore, the variable resistance element may include a phase change material. The phase change material, for example, may include a chalcogenide-based material such as GST (Ge—Sb—Te). Such a variable resistance element may be stabilized to one of a crystalline state and an amorphous state by heat, thereby representing a characteristic that it is switched between different resistant states.

Furthermore, the variable resistance element may include a structure in which a tunnel barrier layer is interposed between two ferromagnetic layers. The ferromagnetic layer may include a material such as NiFeCo or CoFe and the tunnel barrier layer may include a material such as $Al_2O_3$. Such a variable resistance element may represent a characteristic that it is switched between different resistant states according to a magnetization direction of the ferromagnetic layer. For example, when the magnetization directions of the two ferromagnetic layers are parallel to each other, the variable resistance element may be in a low resistance state, and when the magnetization directions of the two ferromagnetic layers are not parallel to each other, the variable resistance element may be in a high resistance state.

FIG. 1 is an embodiment of a magnetic tunnel junction (MTJ) structure in which a tunnel barrier layer is interposed between two ferromagnetic layers.

As illustrated in FIG. 1, a magnetic tunnel junction 100 includes a first electrode layer 110 as a top electrode, a second electrode layer 120 as a bottom electrode, a first ferromagnetic layer 112, a second ferromagnetic layer 122, and a tunnel barrier layer 130 disposed between the pair of ferromagnetic layers 112 and 122.

The first ferromagnetic layer 112 may be a free ferromagnetic layer having a magnetization direction changed according to the direction of a current applied to the magnetic tunnel junction 100, and the second ferromagnetic layer 122 is a finned ferromagnetic layer having a fixed magnetization direction.

The resistance value of such a magnetic tunnel junction 100 is changed according to the direction of the current, so that the magnetic tunnel junction 100 writes data "0" or "1".

Figure 2A:
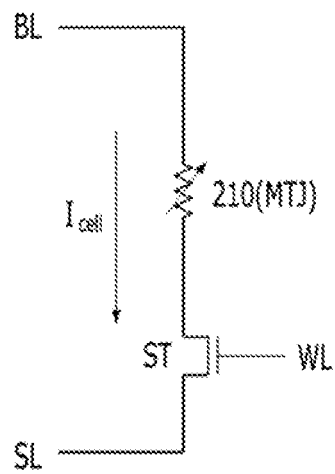
FIG. 2A and FIG. 2B are diagrams for explaining the principle of storing data for a variable resistance element 210.
Figure 2B:
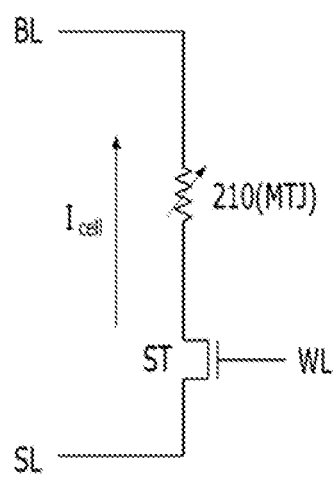

FIGS. 2A and 2B are diagrams for explaining the principle of storing data in a variable resistance element 210. The variable resistance element 210 may be the magnetic tunnel junction 100 shown in FIG. 1.

FIG. 2A is a diagram for explaining the principle of writing data having a "low" logic value in the variable resistance element 210. To select the variable resistance element 210 in which data is to be stored, a word line WL connected to the variable resistance element 210 is activated and a switching transistor ST, that is, a selection element, is turned on. When a current Icell flows from a bit line BL to a source line SL (that is, from the first electrode layer 110 to the second electrode layer 120 of FIG. 1), the magnetization direction of the first ferromagnetic layer 112, that is, the free ferromagnetic layer and the magnetization direction of the second ferromagnetic layer 122, that is, a fixed ferromagnetic layer become parallel to each other. Thus, the variable resistance element 210 is in a low resistance state. When the variable resistance element 210 is in the low resistance state, it is determined that "low" data is stored in the variable resistance element 210.

FIG. 2B is a diagram for explaining the principle of writing data having a "high" logic value in the variable resistance element 210. Similarly, the word line WL connected to the variable resistance element 210 is activated and the switching transistor ST is turned on. When a current Icell flows from the source line SL to the bit line BL, that is, from the second electrode layer 120 to the first electrode layer 110, the magnetization direction of the first ferromagnetic layer 112 and the magnetization direction of the second ferromagnetic layer 122 become anti-parallel, or not parallel to each other. Thus, the variable resistance element 210 is in a high resistance state. When the variable resistance element 210 is in the high resistance state, it is determined that "high" data is stored in the variable resistance element 210.

The logic value of the data stored in the variable resistance element 210 is changed according to the resistance value of the variable resistance element 210. When the difference between the resistance values of the variable resistance element 210 in the high resistance state and the low resistance state is large, the data stored in the variable resistance element 210 may be easily determined. However, when the difference between the resistance values of the variable resistance element 210 in the high resistance state and the low resistance state is small, it may be difficult to determine the data stored in the variable resistance element 210. Therefore, an error may occur in data determination. In this regard, a technology capable of accurately determining the data stored in the variable resistance element 210 even though the difference is small, is in demand.

Figure 3:
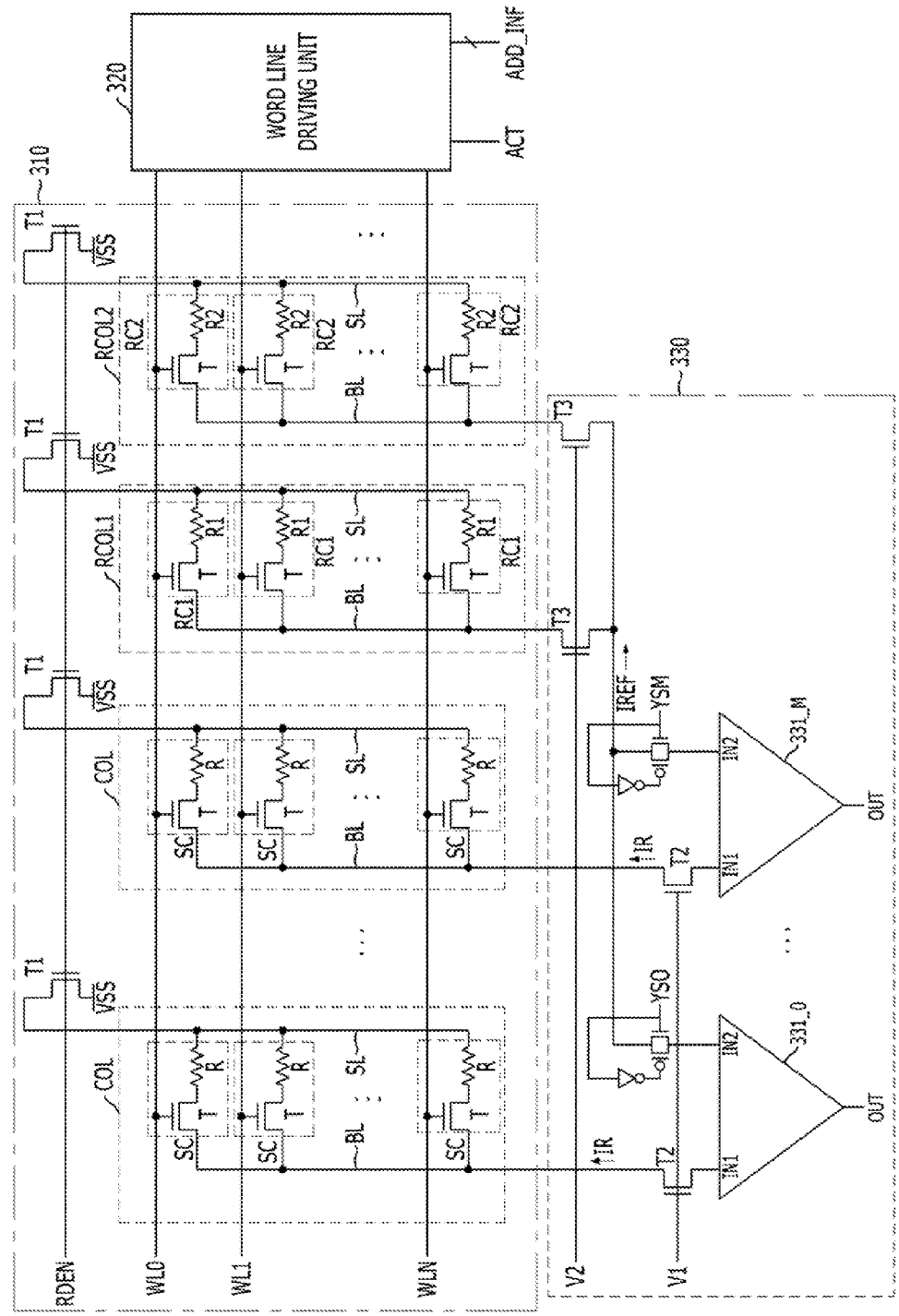
FIG. 3 is an example of the configuration of a memory circuit (device) including a variable resistance element.
Figure 4:
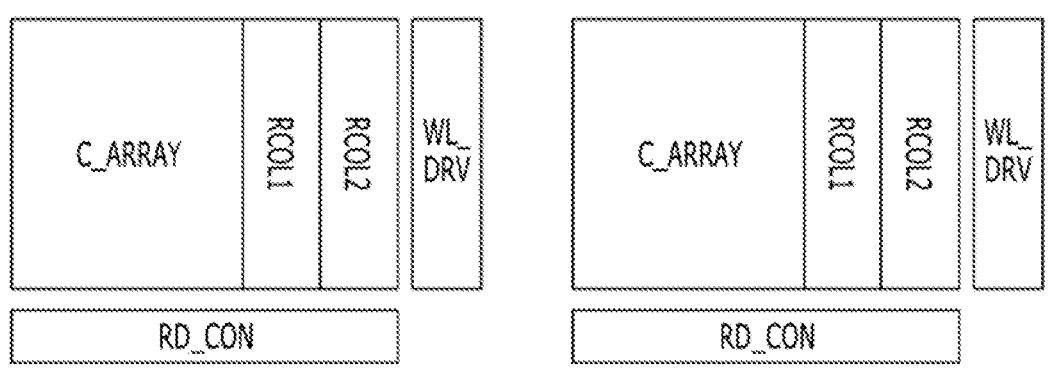
FIG. 4 is a diagram illustrating the state in which two or more cell arrays C_ARRAY, a word line driving unit WL_DRV, and a read control unit RD_CON are arranged in a memory circuit (device).
Figure 5:
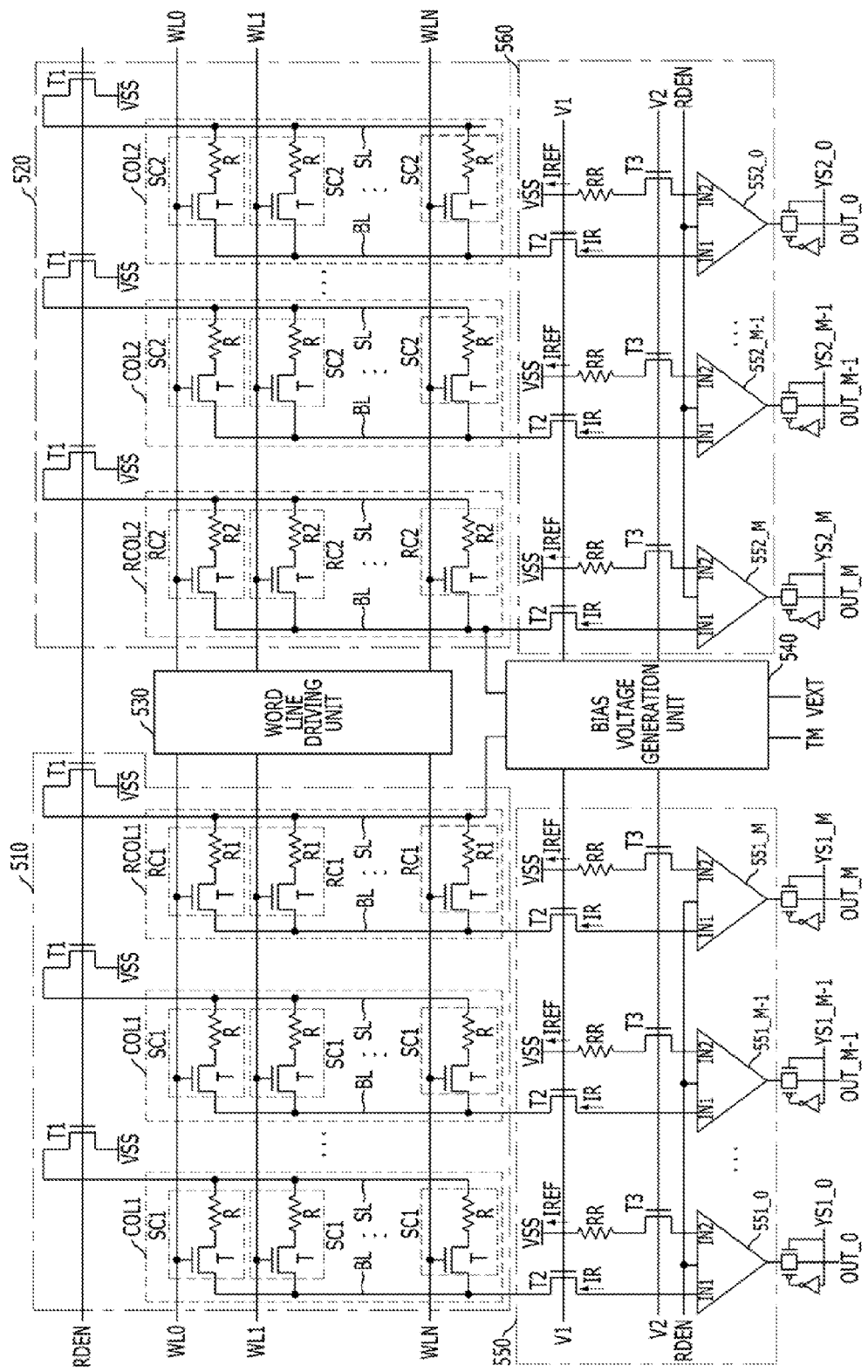
FIG. 5 is an example of the configuration of a memory circuit (device) including a variable resistance element including cell arrays arranged on both sides of a word line driving circuit.

FIGS. 3 to 5 illustrate embodiments of a memory circuit (device) having the aforementioned variable resistance element.

FIG. 3 is an example of the configuration of the memory circuit (device) including the variable resistance element.

As illustrated in FIG. 3, the memory circuit may include a cell array 310, a word line driving unit 320, and a read control unit 330.

The cell array 310 includes a plurality of storage cells SC. The storage cell SC may include a variable resistance element R having resistance changed according to a current flowing therethrough, and a selection element T connected to the variable resistance element R. Storage cells SC may be selected when a corresponding word line is activated and thus the selection element T is turned on. The variable resistance element R may have a first state having a first resistance value or a second state having a second resistance value higher than the first resistance value. The first state may correspond to the aforementioned low resistance state and the second state may correspond to the aforementioned high resistance state. The first state of the variable resistance element R may be defined as the state in which low data is stored, and the second state of the variable resistance element R may be defined as the state in which high data is stored. Alternatively, the first state of the variable resistance element R may be defined as the state in which high data is stored, and the second state of the variable resistance element R may be defined as the state in which low data is stored.

The cell array 310 may include a plurality of columns COL, a first reference column RCOL1, and a second reference column RCOL2. The columns COL, RCOL1, and RCOL2 may include a bit line BL, a source line SL, and cells SC, RC1, and RC2 connected between the bit line BL and the source line SL, respectively. The first reference cell RC1 may include a first reference resistance element R1 having a first resistance value and a selection element T. The second reference cell RC2 may include a second reference resistance element R2 having a second resistance value and a selection element T.

The word line driving unit 320 may activate a word line corresponding to address information ADD_INF among a plurality of word lines WL0 to WLN when an active signal ACT is activated. A selection element T connected to the activated word line may be turned on and a corresponding storage cell SC may be selected.

The read control unit 330 may include a plurality of sensing amplification sections 331_0 to 331_M. In a read operation, a read enable signal RDEN may be activated, and a first bias voltage V1 and a second bias voltage V2 may be applied. When an NMOS transistor T1 is turned on in response to the read enable signal RDEN, a base voltage VSS may be applied to the source line SL. When an NMOS transistor T2 is turned on in response to the first bias voltage V1, first input terminals IN1 of the sensing amplification sections 331_0 to 331_M may be connected to bit lines BL of corresponding columns COL, and a voltage for data reading may be applied to the bit lines BL.

In this case, a current IR corresponding to the resistance value of a variable resistance element R may flow through a first input terminal IN1, a bit line BL, a selected storage cell SC, and a source line SL. Since the amount of the current IR is inversely proportional to the resistance value of the variable resistance element R of the selected storage cell SC, a first current amount flowing when the variable resistance element R has a first resistance value may be larger than a second current amount flowing when the variable resistance element R has a second resistance value.

When an NMOS transistor T3 is turned on in response to the second bias voltage V2, a second input terminal IN2 of a selected sensing amplification section may be connected to the bit lines BL of the reference columns RCOL1 and RCOL2, and a voltage for data reading may be applied to the bit lines BL. The sensing amplification section may be selected when corresponding column selection signals YS0 to YSM are activated.

In this case, a current IREF flows through the second input terminal IN2. The current IREF is sum of two currents (One current passes through a selected first reference cell RC1 and the other current passes through a selected second reference cell RC2). The current IREF may be a reference current IREF serving as a reference for detecting data of the selected storage cell SC. The second bias voltage V2 may be set such that the amount of the reference current IREF is between the first current amount and the second current amount.

A current, which corresponds to the data of the selected storage cell SC, flows through a first input terminal IN1 of a sensing amplification section selected among the plurality of sensing amplification sections 331_0 to 331_M, and the reference current IREF flows through a second input terminal IN2. The selected sensing amplification section compares the amount of current flowing through the first input terminal IN1 with the amount of current flowing through the second input terminal IN2. As a result of the comparison, when the amount of the current IR is larger than the reference current IREF, the variable resistance element R of the selected storage cell SC has a first resistance value, and when the amount of the current IR is smaller than that of the reference current IREF, the variable resistance element R of the selected storage cell SC has a second resistance value, so that the sensing amplification section may output OUT data values corresponding to the resistance values.

FIG. 4 is a diagram illustrating the state in which two or more cell arrays C_ARRAY, a word line driving unit WL_DRV, and a read control unit RD_CON are arranged in a memory circuit (device). The cell arrays C_ARRAY, the word line driving unit WL_DRV, and the read control unit RD_CON illustrated in FIG. 4 may correspond to the cell array 310, the word line driving unit 320, and the read control unit 330 of FIG. 3, respectively.

As illustrated in FIG. 4, for word line driving and read operation control of each cell array C_ARRAY, the word line driving unit WL_DRV and the read control unit RD_CON may be arranged adjacent to each cell array C_ARRAY. Furthermore, the cell array C_ARRAY may include a first reference column RCOL1 and a second reference column RCOL2 to generate a reference current IREF.

In this case, the word line driving unit WL_DRV is arranged for each cell array C_ARRAY and each cell array C_ARRAY includes the first reference column RCOL1 and the second reference column RCOL2, so that a circuit area of the memory circuit (device) and a circuit area of an electronic device including the same, may increase.

FIG. 5 is an example of the configuration of a memory circuit (device) including a variable resistance element.

As illustrated in FIG. 5, the memory circuit may include a first cell array 510, a second cell array 520, a word line driving unit 530, a bias voltage generation unit 540, a first read control unit 550, and a second read control unit 560.

The cell array 510 includes a plurality of storage cells SC. The storage cells SC may include a variable resistance element R having resistance changed according to a current flowing therethrough, and a selection element T connected to the variable resistance element R, respectively. When word lines corresponding to the storage cells SC are activated, the selection element T may be turned on. The variable resistance element R may have a first state having a first resistance value or a second state having a second resistance value higher than the first resistance value. The first state may correspond to the aforementioned low resistance state and the second state may correspond to the aforementioned high resistance state. The first state of the variable resistance element R may be defined as the state in which low data is stored, and the second state of the variable resistance element R may be defined as the state in which high data is stored. Alternatively, the first state of the variable resistance element R may be defined as the state in which high data is stored, and the second state of the variable resistance element R may be defined as the state in which low data is stored.

The word line driving unit 530 may drive a plurality of word lines WL0 to WLN. That is, the word line driving unit 530 may activate a word line corresponding to address information ADD_INF among the plurality of word lines WL0 to WLN when an active signal ACT is activated. A selection element T connected to the activated word line may be turned on and corresponding storage cells SC may be selected.

The first cell array 510 may be arranged on one side of the word line driving unit 530, and may include a plurality of first columns COL1 and a first reference column RCOL1. Each of the columns COL1 and RCOL1 may include a bit line BL, a source line SL, and cells SC1 and RC1 connected between the bit line BL and the source line SL. The first reference cell RC1 may include a first reference resistance element R1 having a first resistance value and a selection element T. In the first cell array 510, the first reference column RCOL1 may be arranged adjacent to the word line driving unit 530.

The second cell array 520 may be arranged on the other side of the word line driving unit 530, and may include a plurality of second columns COL2 and a second reference column RCOL2. Each of the columns COL2 and RCOL2 may include a bit line BL, a source line SL, and storage cells SC2 and RC2 connected between the bit line BL and the source line SL. The second reference cell RC2 may include a second reference resistance element R2 having a second resistance value and a selection element T. In the second cell array 520, the second reference column RCOL2 may be arranged adjacent to the word line driving unit 530.

The bias voltage generation unit 540 may be arranged between the first cell array 510 and the second cell array 520, and may generate a second bias voltage V2 by using a current flowing through a first reference cell RC1 selected in the first reference column RCOL1 and a current flowing through a second reference cell RC2 selected in the second reference column RCOL2 when a read enable signal RDEN is activated. Accordingly, the second bias voltage V2 may be changed according to the resistance values of the variable resistance elements R1 and R2 included in selected reference cells RC1 and RC2. When a test signal TM is activated, the bias voltage generation unit 540 may transfer an external voltage VEXT as the second bias voltage V2. In this case, the second bias voltage V2 may have a constant level regardless of the resistance values of the variable resistance elements R1 and R2 included in the selected reference cells RC1 and RC2. The bias voltage generation unit 540 may be arranged adjacent to the word line driving unit 530.

The first read control unit 550 corresponds to the first cell array 510 and a second read control unit 560 corresponds to the second cell array 520. The first read control unit 550 and the second read control unit 560 may include a plurality of sensing amplification parts 551_0 to 551_M and 552_0 to 552_M, which are activated in response to the read enable signal RDEN, respectively. In a read operation, when the read enable signal RDEN is activated, an NMOS transistor T1 is turned on and a base voltage VSS is applied to the source line SL, so that the first bias voltage V1 and the second bias voltage V2 may be applied to the first cell array 510 and the second cell array 520. The second bias voltage V2 may be generated from the bias voltage generation unit 540.

When an NMOS transistor T2 is turned on in response to the first bias voltage V1, first input terminals IN1 of the sensing amplification parts 551_0 to 551_M and 552_0 to 552_M may be connected to bit lines BL of corresponding columns COL1, COL2, RCOL1, and RCOL2, and a voltage for data reading may be applied to the bit lines BL. In this case, a current IR corresponding to the resistance values of resistive elements R, R1, and R2 may flow through the first input terminals IN1, the bit lines BL, the selected storage cells SC, RC1, and RC2, and the source lines SL in the columns COL1, COL2, RCOL1, and RCOL2 and corresponding sensing amplification parts 551_0 to 551_M and 552_0 to 552_M. Since the amount of the current IR is inversely proportional to the resistance values of the resistive elements R, R1, and R2 of the selected storage cells SC, RC1, and RC2, a first current amount flowing when the resistive elements R, R1, and R2 have a first resistance value may be larger than a second current amount flowing when the resistive elements R, R1, and R2 have a second resistance value.

When an NMOS transistor T3 is turned on in response to the second bias voltage V2, second input terminals IN2 of the sensing amplification parts 551_0 to 551_M and 552_0 to 552_M may be connected to corresponding reference resistance elements RR, and a voltage for data reading may be applied to the reference resistance elements RR. When the voltage is applied, a current IREF may flow through the second input terminals IN2 and the reference resistance elements RR in the sensing amplification parts 551_0 to 551_M and 552_0 to 552_M corresponding to the reference resistance elements RR. The current IREF may be a reference current IREF serving as a reference for detecting data of the selected storage cell SC. The amount of the reference current IREF may be changed according to the resistance values of a first reference cell RC1 and a second reference cell RC2 selected in the first reference column RCOL1 and the second reference column RCOL2, and may be set to between the first current amount and the second current amount.

A current, which corresponds to the data of the selected storage cells SC, RC1, and RC2 flows through the first input terminals IN1 of the sensing amplification parts 551_0 to 551_M and 552_0 to 552_M, and the reference current IREF flows through the second input terminals IN2. The sensing amplification parts 551_0 to 551_M and 552_0 to 552_M compare the amount of the current flowing through the first input terminals IN1 with the amount of the current flowing through the second input terminals IN2. As a result of the comparison, when the amount of the current IR is larger than that of the reference current IREF, the variable resistance element R of the selected storage cell SC has a first resistance value, and when the amount of the current IR is smaller than that of the reference current IREF, the variable resistance element R of the selected storage cell SC has a second resistance value, so that the sensing amplification parts 551_0 to 551_M and 552_0 to 552_M may output data values corresponding to the resistance values.

The sensing amplification parts 551_0 to 551_M and 552_0 to 552_M are selected when corresponding column selection signals YS1_0 to YS1_M and YS2_0 to YS2_M are activated, so that reading results OUT_0 to OUT_M of selected sensing amplification parts 551_0 to 551_M and 552_0 to 552_M may be output.

A read operation of the memory device will be described as follows.

When a word line corresponding to the address information ADD_INF is activated, cells SC, RC1, and RC2 connected to the selected word line are selected, and selection elements T and the NMOS transistor T1 are turned on such that a current for data reading and a current required for generating the second bias voltage V2 may flow through the selected cells SC, RC1, and RC2, so that the sensing amplification parts 551_0 to 551_M and 552_0 to 552_M may be activated. When the first bias voltage V1 is applied, bit lines BL of the columns COL1, COL2, RCOL1, and RCOL2 may be connected to first input terminals IN1 of corresponding sensing amplification parts. The bias voltage generation unit 540 may generate the second bias voltage V2 by using the current flowing through the selected first reference cells RC1 and second reference cells RC2, and reference resistance elements RR of the columns COL1, COL2, RCOL1, and RCOL2 may be connected to the second input terminals IN2 of corresponding sensing amplification parts in response to the second bias voltage V2. In this case, the current IR having a current amount corresponding to data stored in the selected cells SC, RC1, and RC2 may flow through the first input terminals IN1, and the reference current IREF may flow through the second input terminals IN2. Each of the sensing amplification parts 551_0 to 551_M and 552_0 to 552_M may output a result obtained by comparing the amounts of the currents flowing through the first input terminals IN1 and the second input terminals IN2.

The first cell array 510 and the second cell array 520 may correspond to the cell array 310 of FIG. 3. Referring to the memory device of FIG. 3, one cell array is coupled to the word line driving unit 320, and includes the first reference column RCOL1, and the second reference column RCOL2. But, in the memory device shown in FIG. 5, the word line driving unit 530 between the two adjacent cell arrays 510 and 520, and the reference columns RCOL1 and RCOL2 are arranged adjacent to the word line driving unit 530, and the bias voltage generation unit 540 is arranged adjacent to the word line driving unit 530, so that the two cell arrays 510 and 520 may share the aforementioned configurations, resulting in the reduction of the circuit area of the memory device.

Figure 6:
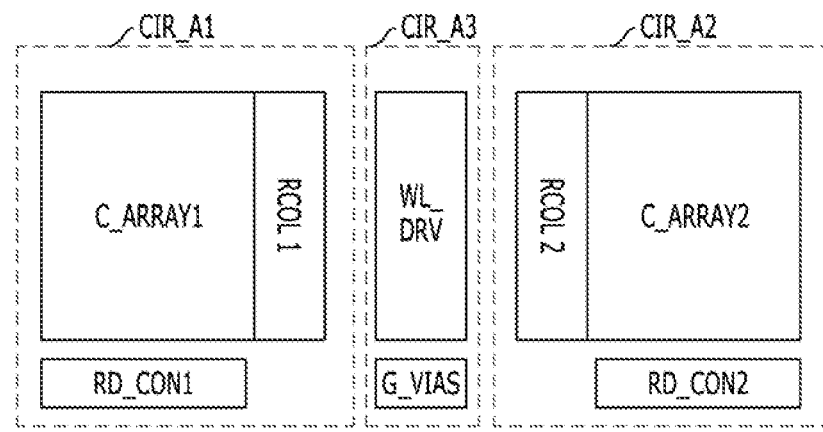
FIG. 6 is a diagram illustrating the state in which two or more cell arrays C_ARRAY1 and C_ARRAY2, a word line driving unit WL_DRV, a bias voltage generation unit G_VIAS, and read control units RD_CON1 and RD_CON2 are arranged in a memory circuit (device).

FIG. 6 is a diagram illustrating the state in which two or more cell arrays C_ARRAY1 and C_ARRAY2, a word line driving unit WL_DRV, a bias voltage generation unit G_VIAS, and read control units RD_CON1 and RD_CON2 are arranged in a memory circuit (device).

The cell arrays C_ARRAY1 and C_ARRAY2, the word line driving unit WL_DRV, the bias voltage generation unit G_VIAS, and the read control units RD_CON1 and RD_CON2 illustrated in FIG. 6 may correspond to the cell arrays 510 and 520, the word line driving unit 530, the bias voltage generation unit 540, and the first and second read control units 550 and 560 of FIG. 5, respectively.

As illustrated in FIG. 6, for word line driving and read operation control of the cell arrays C_ARRAY1 and C_ARRAY2, the word line driving unit WL_DRV may be arranged adjacently between the cell arrays C_ARRAY1 and C_ARRAY2, and a first reference column RCOL1 and a second reference column RCOL2 may be arranged adjacent to the bias voltage generation unit G_VIAS. That is, the first cell array C_ARRAY1 may be arranged adjacent to the bias voltage generation unit G_VIAS on one side of the bias voltage generation unit G_VIAS, and the second cell array C_ARRAY2 may be arranged adjacent to the bias voltage generation unit G_VIAS on the other side of the bias voltage generation unit G_VIAS.

In the memory device, the two cell arrays share the reference columns RCOL1 and RCOL2, the word line driving unit WL_DRV, and the bias voltage generation unit G_VIAS, so that a circuit area may be reduced as compared with the memory devices described in FIGS. 3 and 4.

Although not illustrated in FIG. 6, the memory circuit may include many more cell arrays in addition to the two cell arrays C_ARRAY1 and C_ARRAY2. Such cell arrays may be arranged in a matrix form or a linear form. In this case, the first cell array C_ARRAY1 and the second cell array C_ARRAY2 may be adjacent to each other among a plurality of cell arrays included in the memory circuit. Since the two cell arrays are adjacent to each other, another cell array may not be arranged between the two cell arrays.

As illustrated in FIG. 6, the memory circuit may include a first circuit area CIR_A1, a second circuit area CIR_A2, and a third circuit area CIR_A3. The first circuit area CIR_A1 and the second circuit area CIR_A2 may be arranged spaced apart from each other, and the third circuit area CIR_A3 may be arranged between the first circuit area CIR_A1 and the second circuit area CIR_A2.

The first circuit area CIR_A1 and the second circuit area CIR_A2 may include the cell arrays C_ARRAY1 and C_ARRAY2 and the read control units RD_CON1 and RD_CON2, respectively. The third circuit area CIR_A3 may include the word line driving unit WL_DRV and the bias voltage generation unit G_VIAS.

Since the third circuit area CIR_A3 is an area obtained by arranging the word line driving unit WL_DRV between the first circuit area CIR_A1 and the second circuit area CIR_A2, the bias voltage generation unit G_VIAS is additionally arranged in the third circuit area CIR_A3, so that the memory device may include a new circuit without an increase in additional circuit area. Furthermore, the first reference column RCOL1 and the second reference column RCOL2 are arranged adjacent to the third circuit area CIR_A3, so that the second bias voltage V2 may be generated by using the reference cells RC1 and RC2 selected at both sides. Consequently, since each of the two cell arrays does not require two reference columns, a circuit area may be reduced.

The above and other memory circuits or semiconductor devices based on the disclosed technology can be used in a range of devices or systems. FIGS. 7-11 provide some examples of devices or systems that can implement the memory circuits disclosed herein.

Figure 7:
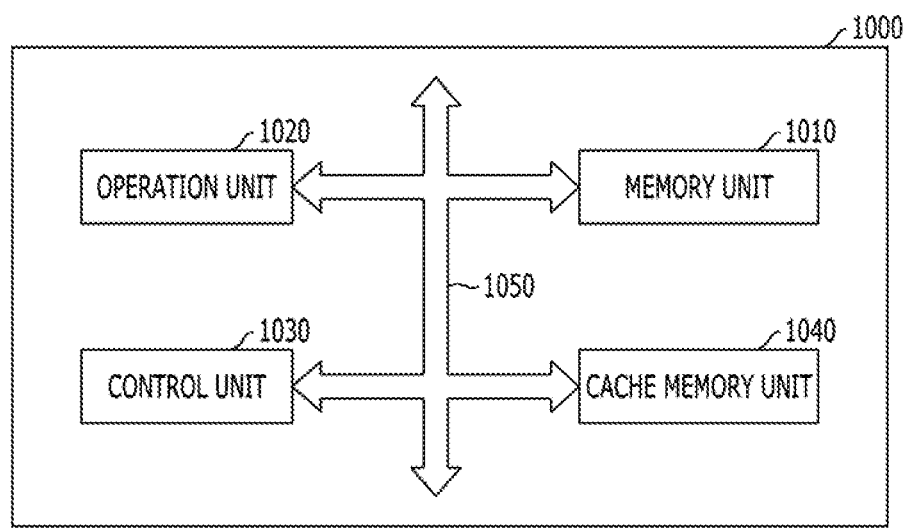
FIG. 7 shows an example of a configuration diagram of a microprocessor implementing memory circuitry based on the disclosed technology.

FIG. 7 shows an example of a configuration diagram of a microprocessor based on another implementation of the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing the operations are stored.

The memory unit 1010 may include one or more of the above-described semiconductor devices in accordance with the implementations. For example, the memory unit 1010 implementation may include a word line driving unit suitable for driving a plurality of word lines; a first cell array arranged at one side of the word line driving unit, wherein the first cell array includes a plurality of first storage cells each having a variable resistance element and being selected when a corresponding word line is activated among the plurality of word lines, and a first reference resistance element having a first resistance value and being arranged adjacent to the word line driving unit; a second cell array arranged at the other side of the word line driving unit, wherein the second cell array includes a plurality of second storage cells, each having a variable resistance element and being selected when a corresponding word line is activated among the plurality of word lines, and a second reference resistance element having a second resistance value and being arranged adjacent to the word line driving unit; a bias voltage generation unit arranged between the first cell array and the second cell array and suitable for generating a bias voltage based on currents flowing through the first reference resistance element and the second reference resistance element; and a read control unit suitable for reading data of storage cells selected among the plurality of first and second storage cells based on the bias voltage. Through this, a size of the memory unit 1010 can be reduced. Consequently, a size of the microprocessor 1000 can be reduced, and portability of the microprocessor 1000 can be improved.

The operation unit 1020 may perform four arithmetical operations or logical operations according to results of the control unit 1030 decoding commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
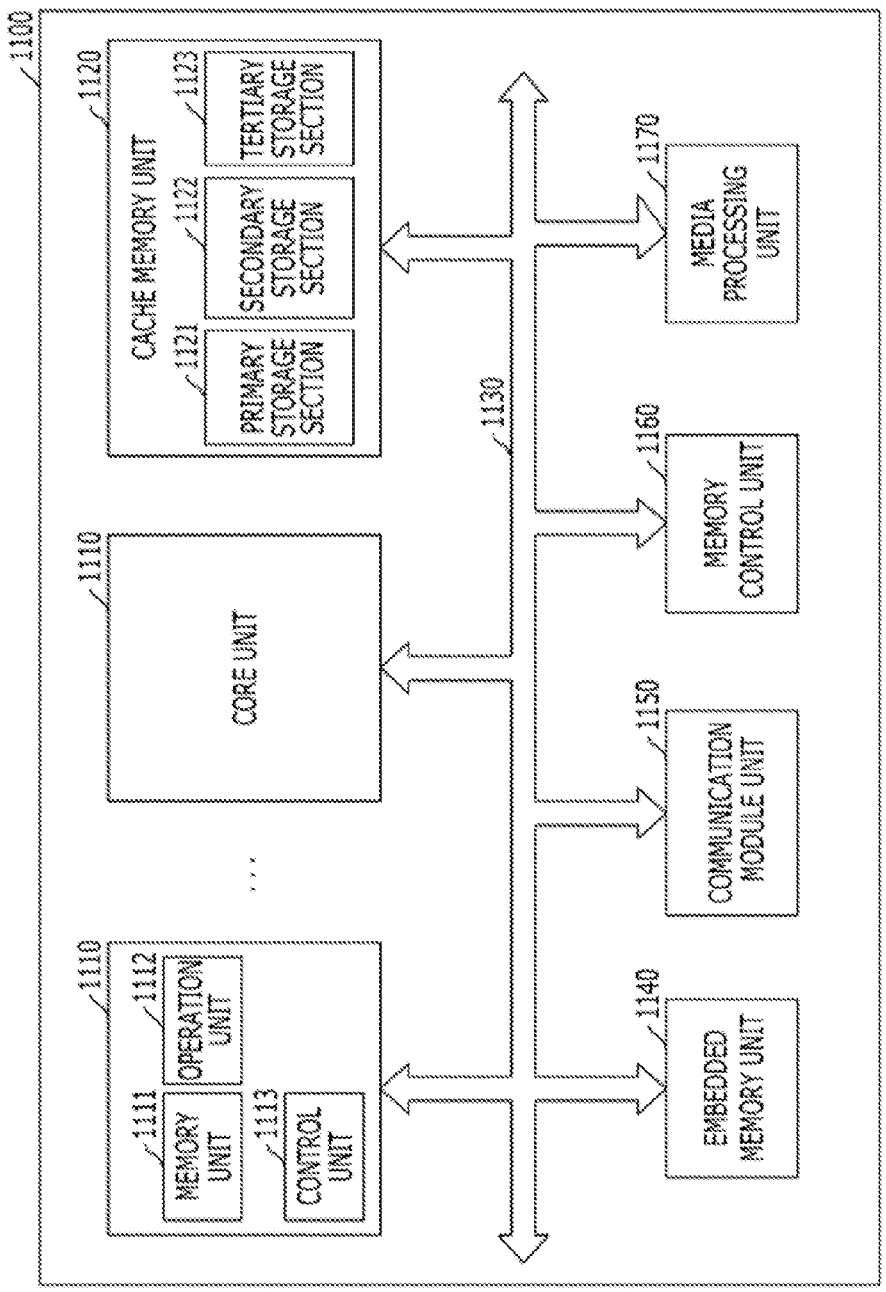
FIG. 8 shows an example of a configuration diagram of a processor implementing memory circuitry based on the disclosed technology.

FIG. 8 is a configuration diagram of a processor based on another implementation of the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to store data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing the operations are stored. The operation unit 1112 is a part which performs operations in the processor 1100. The operation unit 1112 may perform four arithmetical operations, logical operations, according to results of the control unit 1113 decoding commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit or section 1121, a secondary storage unit or section 1122 and a tertiary storage unit or section 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest (fastest). At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 implementation may include a word line driving unit suitable for driving a plurality of word lines; a first cell array arranged at one side of the word line driving unit, wherein the first cell array includes a plurality of first storage cells each having a variable resistance element and being selected when a corresponding word line is activated among the plurality of word lines, and a first reference resistance element having a first resistance value and being arranged adjacent to the word line driving unit; a second cell array arranged at the other side of the word line driving unit, wherein the second cell array includes a plurality of second storage cells, each having a variable resistance element and being selected when a corresponding word line is activated among the plurality of word lines, and a second reference resistance element having a second resistance value and being arranged adjacent to the word line driving unit; a bias voltage generation unit arranged between the first cell array and the second cell array and suitable for generating a bias voltage based on currents flowing through the first reference resistance element and the second reference resistance element; and a read control unit suitable for reading data of storage cells selected among the plurality of first and second storage cells based on the bias voltage. Through this, a size of the cache memory unit 1120 can be reduced. Consequently, a size of the processor 1100 can be reduced, and portability of the processor 1100 can be improved.

Although it was shown in FIG. 8 that all the primary, secondary and tertiary storage units or sections 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes a plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger (faster) than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, ZigBee (ZIGBEE®), a ubiquitous sensor network (USN), Bluetooth (Bluetooth®), radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a Secure Digital (SD) card, a Mini Secure Digital (miniSD™) card, a Micro Secure Digital (microSD™) card, a Secure Digital High Capacity (SDHC™) card, a Memory Stick card, a smart media (SM) card, a multimedia card (MMC), an embedded MMC (eMMC), a CompactFlash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
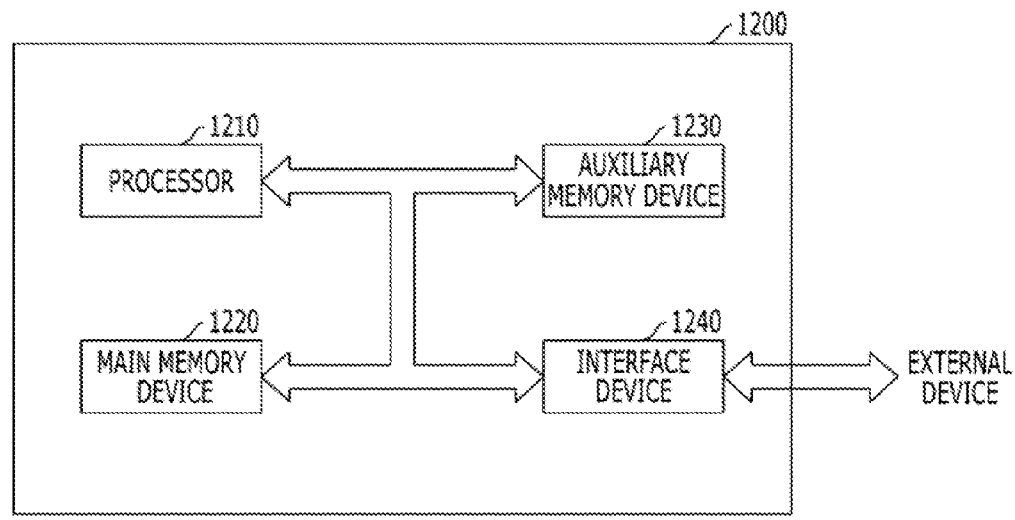
FIG. 9 shows an example of a configuration diagram of a system implementing memory circuitry based on the disclosed technology.

FIG. 9 is a configuration diagram of a system based on another implementation of the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a word line driving unit suitable for driving a plurality of word lines; a first cell array arranged at one side of the word line driving unit, wherein the first cell array includes a plurality of first storage cells each having a variable resistance element and being selected when a corresponding word line is activated among the plurality of word lines, and a first reference resistance element having a first resistance value and being arranged adjacent to the word line driving unit; a second cell array arranged at the other side of the word line driving unit, wherein the second cell array includes a plurality of second storage cells, each having a variable resistance element and being selected when a corresponding word line is activated among the plurality of word lines, and a second reference resistance element having a second resistance value and being arranged adjacent to the word line driving unit; a bias voltage generation unit arranged between the first cell array and the second cell array and suitable for generating a bias voltage based on currents flowing through the first reference resistance element and the second reference resistance element; and a read control unit suitable for reading data of storage cells selected among the plurality of first and second storage cells based on the bias voltage. Through this, a size of the main memory device 1220 can be reduced. Consequently, a size of the system 1200 can be reduced, and portability of the system 1200 can be improved.

Also, the main memory device 1220 may further include a static random access memory (SRAM), a dynamic random access memory (DRAM), and so on, of a volatile memory type in which all contents are erased when a power supply is cut off. That is, the main memory device 1220 may not include the semiconductor devices according to the implementations described above, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a word line driving unit suitable for driving a plurality of word lines; a first cell array arranged at one side of the word line driving unit, wherein the first cell array includes a plurality of first storage cells each having a variable resistance element and being selected when a corresponding word line is activated among the plurality of word lines, and a first reference resistance element having a first resistance value and being arranged adjacent to the word line driving unit; a second cell array arranged at the other side of the word line driving unit, wherein the second cell array includes a plurality of second storage cells, each having a variable resistance element and being selected when a corresponding word line is activated among the plurality of word lines, and a second reference resistance element having a second resistance value and being arranged adjacent to the word line driving unit; a bias voltage generation unit arranged between the first cell array and the second cell array and suitable for generating a bias voltage based on currents flowing through the first reference resistance element and the second reference resistance element; and a read control unit suitable for reading data of storage cells selected among the plurality of first and second storage cells based on the bias voltage. Through this, a size of the auxiliary memory device 1230 can be reduced. Consequently, a size of the system 1200 can be reduced, and portability of the system 1200 can be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a Secure Digital (SD) card, a Mini Secure Digital (miniSD™) card, a Micro Secure Digital (microSD™) card, a Secure Digital High Capacity (SDHC™) card, a Memory Stick card, a smart media (SM) card, a multimedia card (MMC), an embedded MMC (eMMC), a CompactFlash (CF) card, and so on. That is, the auxiliary memory device 1230 may not include the semiconductor devices according to the implementations described above, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a Secure Digital (SD) card, a Mini Secure Digital (miniSD™) card, a Micro Secure Digital (microSD™) card, a Secure Digital High Capacity (SDHC™) card, a Memory Stick card, a smart media (SM) card, a multimedia card (MMC), an embedded MMC (eMMC), a CompactFlash (CF) card, and so on.

The interface device 1240 may be to perform exchange of commands and data between the system 1200 of the present implementation and an external device. The interface device 1240 may be a keypad, a keyboard, a mouse, a speaker, a mike (microphone), a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, ZigBee (ZIG-BEE®), a ubiquitous sensor network (USN), Bluetooth (Bluetooth®), radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
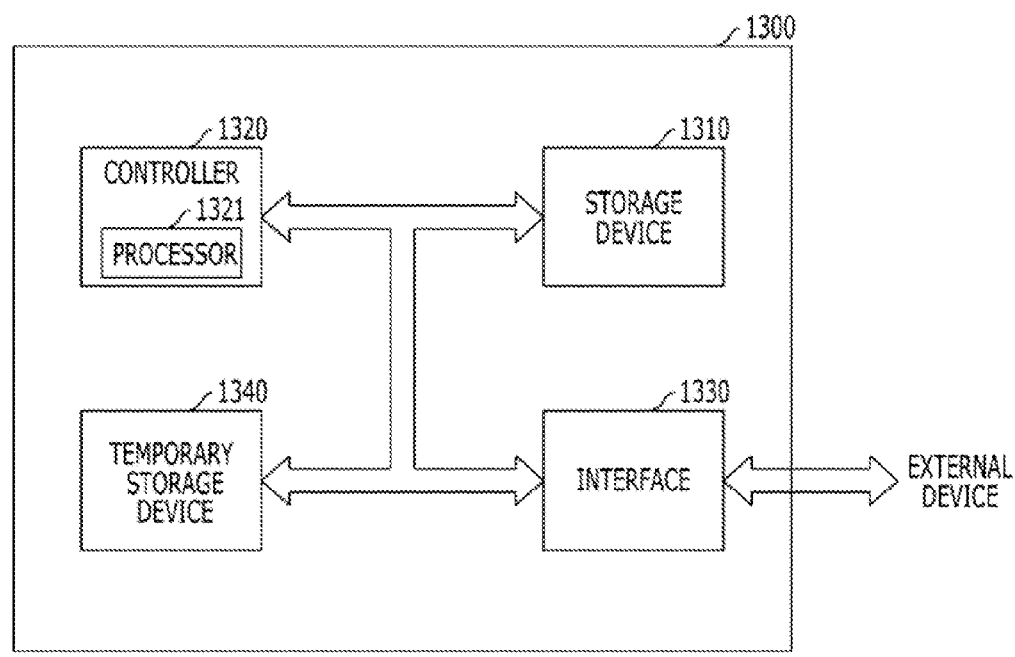
FIG. 10 shows an example of a configuration diagram of a data storage system implementing memory circuitry based on the disclosed technology.

FIG. 10 is a configuration diagram of a data storage system based on another implementation of the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a Secure Digital (SD) card, a Mini Secure Digital (miniSD™) card, a Micro Secure Digital (microSD™) card, a Secure Digital High Capacity (SDHC™) card, a Memory Stick card, a smart media (SM) card, a multimedia card (MMC), an embedded MMC (eMMC), a CompactFlash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a Secure Digital (SD) card, a Mini Secure Digital (miniSD™) card, a Micro Secure Digital (microSD™) card, a Secure Digital High Capacity (SDHC™) card, a Memory Stick card, a smart media (SM) card, a multimedia card (MMC), an embedded MMC (eMMC), a CompactFlash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily for efficiently transferring data between the interface 1330 and the storage device 1310 according to diversifications and high performance of an interface with an external device, a controller and a system. For example, the temporary storage device 1340 for temporarily storing data may include a word line driving unit suitable for driving a plurality of word lines; a first cell array arranged at one side of the word line driving unit, wherein the first cell array includes a plurality of first storage cells each having a variable resistance element and being selected when a corresponding word line is activated among the plurality of word lines, and a first reference resistance element having a first resistance value and being arranged adjacent to the word line driving unit; a second cell array arranged at the other side of the word line driving unit, wherein the second cell array includes a plurality of second storage cells, each having a variable resistance element and being selected when a corresponding word line is activated among the plurality of word lines, and a second reference resistance element having a second resistance value and being arranged adjacent to the word line driving unit; a bias voltage generation unit arranged between the first cell array and the second cell array and suitable for generating a bias voltage based on currents flowing through the first reference resistance element and the second reference resistance element; and a read control unit suitable for reading data of storage cells selected among the plurality of first and second storage cells based on the bias voltage. Through this, a size of the temporary storage device 1340 can be reduced. Consequently, a size of the data storage system 1300 can be reduced, and portability of the data storage system 1300 can be improved.

Figure 11:
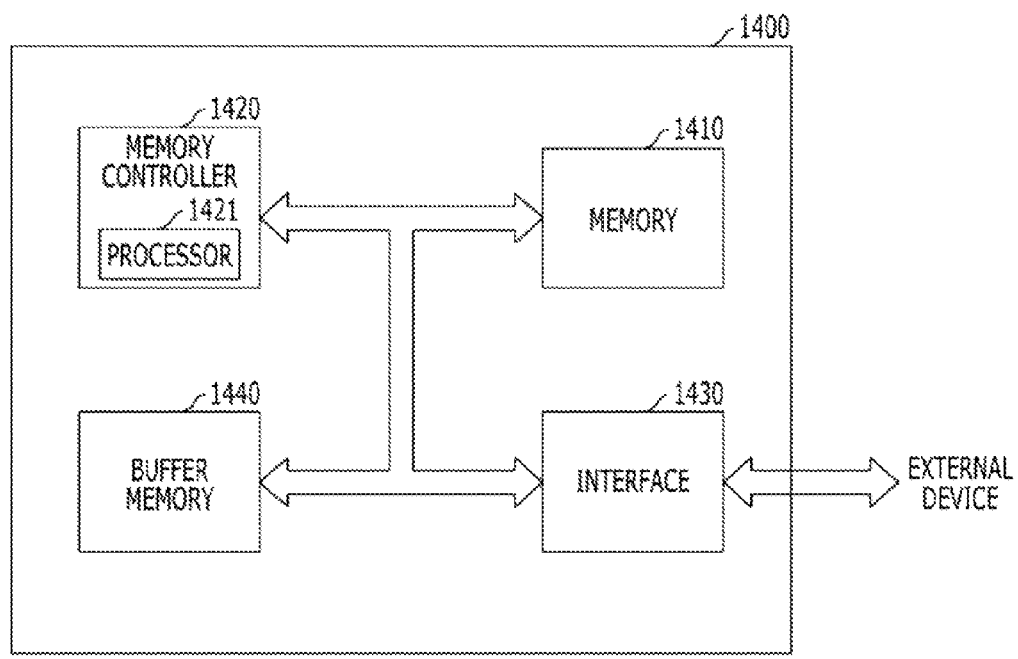
FIG. 11 shows an example of a configuration diagram of a memory system implementing memory circuitry based on the disclosed technology.

FIG. 11 is a configuration diagram of a memory system based on another implementation of the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a Secure Digital (SD) card, a Mini Secure Digital (miniSD™) card, a Micro Secure Digital (microSD™) card, a Secure Digital High Capacity (SDHC™) card, a Memory Stick card, a smart media (SM) card, a multimedia card (MMC), an embedded MMC (eMMC), a CompactFlash (CF) card, and so on.

The memory 1410 for storing data may include one or more of the above-described semiconductor devices in accordance with the implementations. For example, the memory 1410 may include a word line driving unit suitable for driving a plurality of word lines; a first cell array arranged at one side of the word line driving unit, wherein the first cell array includes a plurality of first storage cells each having a variable resistance element and being selected when a corresponding word line is activated among the plurality of word lines, and a first reference resistance element having a first resistance value and being arranged adjacent to the word line driving unit; a second cell array arranged at the other side of the word line driving unit, wherein the second cell array includes a plurality of second storage cells, each having a variable resistance element and being selected when a corresponding word line is activated among the plurality of word lines, and a second reference resistance element having a second resistance value and being arranged adjacent to the word line driving unit; a bias voltage generation unit arranged between the first cell array and the second cell array and suitable for generating a bias voltage based on currents flowing through the first reference resistance element and the second reference resistance element; and a read control unit suitable for reading data of storage cells selected among the plurality of first and second storage cells based on the bias voltage. Through this, a size of the memory 1410 can be reduced. Consequently, a size of the memory 1410 can be reduced, and portability of the memory 1410 can be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from outside of the memory system 1400.

The interface 1430 is to perform exchange of commands and data between the memory system 1400 and the external device. The interface 1430 may be compatible with interfaces which are used in devices, such as a USB memory (universal serial bus memory), a Secure Digital (SD) card, a Mini Secure Digital (miniSD™) card, a Micro Secure Digital (microSD™) card, a Secure Digital High Capacity (SDHC™) card, a Memory Stick card, a smart media (SM) card, a multimedia card (MMC), an embedded MMC (eMMC), a CompactFlash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. Through this, a size of the buffer memory 1440 can be reduced. Consequently, a size of the memory 1410 can be reduced, and portability of the memory 1410 can be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. That is, the buffer memory 1440 may not include the semiconductor devices according to the implementations described above, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated.

What is claimed is:

1. An electronic device including a semiconductor memory unit, wherein the semiconductor memory unit comprises:
    a word line driving unit for driving a plurality of word lines;
    a first cell array arranged at one side of the word line driving unit, wherein the first cell array includes a plurality of first storage cells each having a variable resistance element and being selected when a corresponding word line is activated among the plurality of word lines, and a first reference resistance element having a first resistance value and being arranged adjacent to the word line driving unit;
    a second cell array arranged at the other side of the word line driving unit, wherein the second cell array includes a plurality of second storage cells, each having a variable resistance element and being selected when a corresponding word line is activated among the plurality of word lines, and a second reference resistance element having a second resistance value and being arranged adjacent to the word line driving unit;
    a bias voltage generation unit, arranged between the first cell array and the second cell array, for generating a bias voltage based on currents flowing through the first reference resistance element included in the first cell array and the second reference resistance element included in the second cell array;
    a first read control unit for reading data of first storage cells selected among the plurality of first storage cells based on the bias voltage; and
    a second read control unit for reading data of second storage cells selected among the plurality of second storage cells based on the bias voltage,
    wherein the first and second read control units generate a reference current based on the bias voltage, compares the currents flowing through the selected first and second storage cells with the reference current to read the data of the selected first and second storage cells.

2. The electronic device of claim 1, wherein the bias voltage generation unit is arranged adjacent to the word line driving unit.

3. The electronic device of claim 1, wherein the variable resistance element has a first resistance value when first data is stored in a corresponding storage cell, and has a second resistance value different from the first resistance value when second data different from the first data is stored in the corresponding storage cell.

4. The electronic device of claim 3, wherein the reference current has a current amount between a current amount of a first read current flowing when the first data is stored in a corresponding storage cell and a current amount of a second read current flowing when the second data is stored in the corresponding storage cell.

5. The electronic device of claim 1, wherein the bias voltage generation unit transfers an external voltage as the bias voltage when a test signal is activated.

6. The electronic device of claim 1, wherein the variable resistance element includes one or more of metal oxide, a phase change material, and a structure in which a tunnel barrier layer is interposed between two ferromagnetic layers.

7. An electronic device including a semiconductor memory unit, wherein the semiconductor memory unit comprises:
    a word line driving unit for driving a plurality of word lines;
    a first cell array arranged at one side of the word line driving unit, wherein the first cell array includes one or more first columns, each of which includes a plurality of first storage cells each having a variable resistance element and being selected when a corresponding word line is activated, and a first reference column arranged adjacent to the word line driving unit, which includes a plurality of first reference cells each having a first resistance value and being selected when a corresponding word line is activated;
    a second cell array arranged at the other side of the word line driving unit, wherein the second cell array includes one or more second columns, each of which includes a plurality of second storage cells each having a variable resistance element and being selected when a corresponding word line is activated, and a second reference column arranged adjacent to the word line driving unit, which includes a plurality of second reference cells having a second resistance value and being selected when a corresponding word line is activated;
    a bias voltage generation unit arranged between the first cell array and the second cell array, for generating a bias voltage based on currents flowing through a selected first reference cell included in the first reference column and a selected second reference cell included in the second reference column; and
    a first read control unit for reading data of first storage cells selected among the first columns based on the bias voltage and the currents flowing through the selected first reference cell and selected second reference cell;
    a second read control unit for reading data of second storage cells selected among the second columns based on the bias voltage and the currents flowing through the selected first reference cell and selected second reference cell;
    wherein the first and second read control units generate a reference current based on the bias voltage, compares the currents flowing through selected first and second storage cells with the reference current to read data of the selected first and second storage cells.

8. The electronic device of claim 7, wherein the bias voltage generation unit is arranged adjacent to the word line driving unit.

9. The electronic device of claim 7, wherein each of the one or more first columns comprises:
   a bit line coupled to the first read control unit and coupled to one end of a corresponding plurality of first storage cells; and
   a source line coupled to the other end of the corresponding plurality of first storage cells.

10. The electronic device of claim 7, wherein each of the one or more second columns comprises:
    a bit line coupled to the second read control unit and coupled to one end of a corresponding plurality of second storage cells; and
    a source line coupled to the other end of the corresponding plurality of second storage cells.

11. The electronic device of claim 7, wherein the bias voltage generation unit transfers an external voltage as the bias voltage when a test signal is activated.

12. The electronic device of claim 7, wherein the first reference column comprises:
    a bit line coupled to one end of the plurality of first reference cells; and
    a source line coupled to the other end of the plurality of first reference cells.

13. The electronic device of claim 7, wherein the second reference column comprises:
    a bit line coupled to one end of the plurality of second reference cells; and
    a source line coupled to the other end of the plurality of second reference cells.

14. The electronic device of claim 7, wherein the variable resistance element includes one or more of metal oxide, a phase change material, and a structure in which a tunnel barrier layer is interposed between two ferromagnetic layers.

15. The electronic device according to claim 7, further comprising a processor which includes:
    a core unit configured to perform, based on a command inputted from outside of the processor, an operation corresponding to the command, by using data;
    a cache memory unit for storing data for performing the operation, data corresponding to a result of performing the operation, or an address of data for which the operation is performed; and
    a bus interface, connected between the core unit and the cache memory unit, for transmitting data between the core unit and the cache memory unit,
    wherein the semiconductor memory unit is part of the cache memory unit in the processor.

16. The electronic device according to claim 7, further comprising a data storage system which includes:
    a storage device for storing data and conserve stored data regardless of power supply;
    a controller for controlling input and output of data to and from the storage device according to a command inputted from outside of the data storage system;
    a temporary storage device for temporarily storing data exchanged between the storage device and the outside; and
    an interface suitable for performing communication between at least one of the storage device, the controller and the temporary storage device and the outside of the data storage system,
    wherein the semiconductor memory unit is part of the storage device or the temporary storage device in the data storage system.

* * * * *